United States Patent
Lim et al.

[11] Patent Number: 6,100,683
[45] Date of Patent: Aug. 8, 2000

[54] DRIVE IN-SITU HEAD DISC INTERFERENCE DETECTION USING STANDARD DEVIATION OF READ BACK SIGNAL FREQUENCY

[75] Inventors: Bernard Tuang Liang Lim; Alan Choon Young Tan; Myint Ngwe; Beng Wee Quak, all of Singapore, Singapore

[73] Assignee: Seagate Technology, Inc., Scotts Valley, Calif.

[21] Appl. No.: 09/024,668

[22] Filed: Feb. 17, 1998

Related U.S. Application Data

[60] Provisional application No. 60/052,421, Jul. 14, 1997.

[51] Int. Cl.[7] .................................................... G01R 33/12
[52] U.S. Cl. ............................................. 324/212; 360/31
[58] Field of Search .................................. 324/212, 210; 360/113, 103, 31, 53, 25, 137; 73/105

[56] References Cited

U.S. PATENT DOCUMENTS

| | | | |
|---|---|---|---|
| 5,150,050 | 9/1992 | Genheimer et al. | 324/212 |
| 5,168,412 | 12/1992 | Doan et al. | 324/212 |
| 5,410,439 | 4/1995 | Egbert et al. | 324/212 |
| 5,532,586 | 7/1996 | Ishikawa | 324/212 |
| 5,600,500 | 2/1997 | Madsen et al. | 360/46 |
| 5,838,153 | 11/1998 | Inbar | 324/212 |

*Primary Examiner*—Jay Patidar
*Attorney, Agent, or Firm*—Merchant & Gould P.C.

[57] ABSTRACT

Head disc interference is detected and analyzed using the standard deviation of read back signal frequency. First, the amount of longitudinal head oscillation affecting transducer read/write heads located in the hard drive is measured. Measuring the longitudinal head oscillation is achieved by determining the degree of frequency modulation associated with the read-back signal as compared with a constant frequency used to write the information. Second, this measured amount of oscillation is compared to a predefined threshold value. Finally, a head disc interference alarm is activated when the oscillation is greater than the defined threshold value.

12 Claims, 10 Drawing Sheets

| TABLE 1 FREQUENCY REGISTER VALUES OF DRIVE SIGNALS WITH VARIOUS MODULATION INDEXES FOR HEAD 0. | | | | | | | | |
|---|---|---|---|---|---|---|---|---|
| | FREQUENCY REGISTER VALUES | | | | | | | |
| HEAD 0 | HEXADECIMAL | | | | DECIMAL | | | |
| SAMPLE | β=0 | β=0.05 | β=0.1 | β=0.5 | β=0 | β=0.05 | β=0.1 | β=0.5 |
| 1 | 2B | 2D | 2C | 1D | 43 | 45 | 44 | 29 |
| 2 | 2E | 2C | 2D | 2C | 46 | 44 | 45 | 44 |
| 3 | 2C | 30 | 33 | 3C | 44 | 48 | 51 | 60 |
| 4 | 2B | 2E | 2E | 35 | 43 | 46 | 46 | 53 |
| 5 | 2D | 2E | 27 | 3A | 45 | 46 | 39 | 58 |
| 6 | 2A | 28 | 2C | 26 | 42 | 40 | 44 | 38 |
| 7 | 29 | 2E | 2A | 21 | 41 | 46 | 42 | 33 |
| 8 | 2B | 2A | 32 | 3D | 43 | 42 | 50 | 61 |
| 9 | 2C | 2B | 2C | 27 | 44 | 43 | 44 | 39 |
| 10 | 2A | 2E | 2E | 3D | 42 | 46 | 46 | 61 |
| 11 | 2C | 2B | 2F | 41 | 44 | 43 | 47 | 65 |
| 12 | 2B | 2E | 28 | 20 | 43 | 46 | 40 | 32 |
| 13 | 2D | 2B | 2F | 2A | 45 | 43 | 47 | 42 |
| 14 | 2A | 2A | 30 | 28 | 42 | 42 | 48 | 40 |
| 15 | 2D | 2A | 26 | 1E | 45 | 42 | 38 | 30 |
| | | | | STDEV | 1.407463 | 2.199567 | 3.788454 | 12.75408 |
| | | | | MAX | 46 | 48 | 51 | 65 |
| | | | | MIN | 41 | 40 | 38 | 29 |

FIG.4A

| TABLE 2 FREQUENCY REGISTER VALUES OF DRIVE SIGNALS WITH VARIOUS MODULATION INDEXES FOR HEAD 1. | | | | | | | | |
|---|---|---|---|---|---|---|---|---|
| | FREQUENCY REGISTER VALUES | | | | | | | |
| HEAD 1 | HEXADECIMAL | | | | DECIMAL | | | |
| SAMPLE | β=0 | β=0.05 | β=0.1 | β=0.5 | β=0 | β=0.05 | β=0.1 | β=0.5 |
| 1 | 2D | 2C | 2A | 33 | 45 | 44 | 42 | 51 |
| 2 | 28 | 2B | 2B | 1E | 40 | 43 | 43 | 30 |
| 3 | 2C | 27 | 2A | 33 | 44 | 39 | 42 | 51 |
| 4 | 2A | 28 | 2F | 1A | 42 | 40 | 47 | 26 |
| 5 | 2C | 2A | 2B | 3D | 44 | 42 | 43 | 61 |
| 6 | 2A | 2F | 2C | 39 | 42 | 47 | 44 | 57 |
| 7 | 2D | 2A | 30 | 22 | 45 | 42 | 48 | 34 |
| 8 | 2D | 2F | 26 | 20 | 45 | 47 | 38 | 32 |
| 9 | 2C | 2F | 2C | 41 | 44 | 47 | 44 | 65 |
| 10 | 29 | 2A | 2E | 32 | 41 | 42 | 46 | 50 |
| 11 | 2D | 2E | 2F | 25 | 45 | 46 | 47 | 37 |
| 12 | 28 | 2D | 27 | 34 | 40 | 45 | 39 | 52 |
| 13 | 2C | 2B | 30 | 19 | 44 | 43 | 48 | 25 |
| 14 | 2B | 2A | 31 | 34 | 43 | 42 | 49 | 52 |
| 15 | 2B | 28 | 26 | 1E | 43 | 40 | 38 | 30 |
| | | | | STDEV | 1.76743 | 2.65832 | 3.642344 | 13.43698 |
| | | | | MAX | 45 | 47 | 49 | 65 |
| | | | | MIN | 40 | 39 | 38 | 25 |

FIG.4B

| TABLE 3 FREQUENCY REGISTER VALUES OF DRIVE SIGNALS WITH VARIOUS MODULATION INDEXES FOR HEAD 2. | | | | | | | |
|---|---|---|---|---|---|---|---|
| FREQUENCY REGISTER VALUES | | | | | | | |
| HEAD 2 | HEXADECIMAL | | | | DECIMAL | | |
| SAMPLE | $\beta=0$ | $\beta=0.05$ | $\beta=0.1$ | $\beta=0.5$ | $\beta=0$ | $\beta=0.05$ | $\beta=0.1$ | $\beta=0.5$ |
| 1 | 2C | 2A | 2A | 1C | 44 | 42 | 42 | 28 |
| 2 | 2F | 2E | 26 | 3B | 47 | 46 | 38 | 59 |
| 3 | 2B | 2E | 2D | 1B | 43 | 46 | 45 | 27 |
| 4 | 2E | 29 | 2A | 36 | 46 | 41 | 42 | 54 |
| 5 | 2A | 29 | 2E | 2C | 42 | 41 | 46 | 44 |
| 6 | 2E | 27 | 2E | 1E | 46 | 39 | 46 | 30 |
| 7 | 2D | 2D | 2B | 21 | 45 | 45 | 43 | 33 |
| 8 | 2C | 2E | 29 | 1F | 44 | 46 | 41 | 31 |
| 9 | 2D | 29 | 30 | 1D | 45 | 41 | 48 | 29 |
| 10 | 2D | 2C | 28 | 38 | 45 | 44 | 40 | 56 |
| 11 | 2C | 2C | 2D | 30 | 44 | 44 | 45 | 48 |
| 12 | 2B | 29 | 2C | 1E | 43 | 41 | 44 | 30 |
| 13 | 2C | 2A | 27 | 2E | 44 | 42 | 39 | 46 |
| 14 | 2B | 2E | 2D | 2E | 43 | 46 | 45 | 46 |
| 15 | 2E | 2B | 2D | 23 | 46 | 43 | 45 | 35 |
| | | | | STDEV | 1.407463 | 2.325838 | 2.865227 | 11.18971 |
| | | | | MAX | 47 | 46 | 48 | 59 |
| | | | | MIN | 42 | 39 | 38 | 27 |

FIG.4C

| TABLE 4 FREQUENCY REGISTER VALUES OF DRIVE SIGNALS WITH VARIOUS MODULATION INDEXES FOR HEAD 3. | | | | | | | |
|---|---|---|---|---|---|---|---|
| FREQUENCY REGISTER VALUES | | | | | | | |
| HEAD 3 | HEXADECIMAL | | | | DECIMAL | | |
| SAMPLE | $\beta=0$ | $\beta=0.05$ | $\beta=0.1$ | $\beta=0.5$ | $\beta=0$ | $\beta=0.05$ | $\beta=0.1$ | $\beta=0.5$ |
| 1 | 2F | 29 | 2E | 1B | 47 | 41 | 46 | 27 |
| 2 | 2C | 2E | 30 | 32 | 44 | 46 | 48 | 50 |
| 3 | 2C | 28 | 28 | 3C | 44 | 40 | 40 | 60 |
| 4 | 2E | 2C | 2A | 2D | 46 | 44 | 42 | 45 |
| 5 | 2B | 2E | 29 | 3D | 43 | 46 | 41 | 61 |
| 6 | 29 | 29 | 2A | 23 | 41 | 41 | 42 | 35 |
| 7 | 2D | 2A | 2B | 3D | 45 | 42 | 43 | 61 |
| 8 | 2B | 32 | 30 | 26 | 43 | 50 | 48 | 38 |
| 9 | 2A | 2C | 2E | 26 | 42 | 44 | 46 | 38 |
| 10 | 2C | 2B | 2B | 3B | 44 | 43 | 43 | 59 |
| 11 | 2E | 2B | 2C | 21 | 46 | 43 | 44 | 33 |
| 12 | 2E | 2B | 2C | 1E | 46 | 43 | 44 | 30 |
| 13 | 2D | 2D | 31 | 1E | 45 | 45 | 49 | 30 |
| 14 | 2C | 2D | 2E | 1C | 44 | 45 | 46 | 28 |
| 15 | 2A | 2B | 2F | 1C | 42 | 43 | 47 | 28 |
| | | | | STDEV | 1.726543 | 2.491892 | 2.772312 | 13.2873 |
| | | | | MAX | 47 | 50 | 49 | 61 |
| | | | | MIN | 41 | 40 | 40 | 27 |

FIG.4D

| TABLE 5 FREQUENCY REGISTER VALUES OF DRIVE SIGNALS WITH VARIOUS MODULATION INDEXES FOR HEAD 4. | | | | | | | | |
|---|---|---|---|---|---|---|---|---|
| | FREQUENCY REGISTER VALUES | | | | | | | |
| HEAD 4 | HEXADECIMAL | | | | DECIMAL | | | |
| SAMPLE | β=0 | β=0.05 | β=0.1 | β=0.5 | β=0 | β=0.05 | β=0.1 | β=0.5 |
| 1 | 2D | 2F | 30 | 35 | 45 | 47 | 48 | 53 |
| 2 | 2C | 2C | 2B | 2F | 44 | 44 | 43 | 47 |
| 3 | 2B | 2A | 2F | 38 | 43 | 42 | 47 | 56 |
| 4 | 2C | 27 | 2B | 1C | 44 | 39 | 43 | 28 |
| 5 | 2E | 2D | 29 | 3F | 46 | 45 | 41 | 63 |
| 6 | 2B | 2D | 2F | 22 | 43 | 45 | 47 | 34 |
| 7 | 2A | 2C | 29 | 1C | 42 | 44 | 41 | 28 |
| 8 | 2D | 2B | 29 | 3C | 45 | 43 | 41 | 60 |
| 9 | 2F | 2B | 30 | 1F | 47 | 43 | 48 | 31 |
| 10 | 2C | 2A | 33 | 1B | 44 | 42 | 51 | 27 |
| 11 | 2F | 2E | 2D | 29 | 47 | 46 | 45 | 41 |
| 12 | 2E | 2C | 31 | 37 | 46 | 44 | 49 | 55 |
| 13 | 29 | 29 | 29 | 1F | 41 | 41 | 41 | 31 |
| 14 | 2B | 2C | 30 | 23 | 43 | 44 | 48 | 35 |
| 15 | 2C | 29 | 2D | 1E | 44 | 41 | 45 | 30 |
| | | | | STDEV | 1.75119 | 2.093072 | 3.63671 | 13.05191 |
| | | | | MAX | 47 | 47 | 51 | 63 |
| | | | | MIN | 41 | 39 | 41 | 27 |

FIG.4E

| TABLE 6 FREQUENCY REGISTER VALUES OF DRIVE SIGNALS WITH VARIOUS MODULATION INDEXES FOR HEAD 5. | | | | | | | | |
|---|---|---|---|---|---|---|---|---|
| | FREQUENCY REGISTER VALUES | | | | | | | |
| HEAD 5 | HEXADECIMAL | | | | DECIMAL | | | |
| SAMPLE | β=0 | β=0.05 | β=0.1 | β=0.5 | β=0 | β=0.05 | β=0.1 | β=0.5 |
| 1 | 2F | 2A | 2D | 3D | 47 | 42 | 45 | 61 |
| 2 | 2C | 2A | 2A | 1A | 44 | 42 | 42 | 26 |
| 3 | 2C | 2D | 28 | 2C | 44 | 45 | 40 | 44 |
| 4 | 2C | 29 | 2A | 22 | 44 | 41 | 42 | 34 |
| 5 | 2A | 2B | 2D | 2E | 42 | 43 | 45 | 46 |
| 6 | 2A | 2E | 2A | 1F | 42 | 46 | 42 | 31 |
| 7 | 2C | 2B | 31 | 26 | 44 | 43 | 49 | 38 |
| 8 | 2B | 2C | 2E | 1E | 43 | 44 | 46 | 30 |
| 9 | 2D | 2E | 28 | 37 | 45 | 46 | 40 | 55 |
| 10 | 2C | 29 | 2D | 35 | 44 | 41 | 45 | 53 |
| 11 | 2A | 2E | 2E | 30 | 42 | 46 | 46 | 48 |
| 12 | 2D | 2C | 29 | 3D | 45 | 44 | 41 | 61 |
| 13 | 2C | 29 | 29 | 42 | 44 | 41 | 41 | 66 |
| 14 | 2C | 2F | 31 | 27 | 44 | 47 | 49 | 39 |
| 15 | 2C | 31 | 31 | 3E | 44 | 49 | 49 | 62 |
| | | | | STDEV | 1.302013 | 2.44949 | 3.248443 | 13.04096 |
| | | | | MAX | 47 | 49 | 49 | 66 |
| | | | | MIN | 42 | 41 | 40 | 26 |

FIG.4F ardware.

DRIVE IN-SITU HEAD DISC INTERFERENCE DETECTION USING STANDARD DEVIATION OF READ BACK SIGNAL FREQUENCY

CROSS-REFERENCE TO RELATED APPLICATIONS

This invention relates to Provisional Application Ser. No. 60/052,421, filed Jul. 14, 1997. The contents of that application are incorporated by reference herein.

BACKGROUND OF THE INVENTION

1. Field of the Invention.

This invention relates generally to an apparatus, process, and article of manufacture for detecting head disc interference in hard disc drives, and in particular to embodiments for detecting head disc interference by determining the spread or distribution of the read back signal frequency.

2. Description of Related Art.

Modern computers use various forms of persistent storage media to store electronic information, such as computer data files or program files. One common form of storage media is a hard disc drive. Since important data may be stored on the drive permanently, detecting and repairing a defective drive may prevent the loss of valuable information. Some current methods for detecting defects and predicting drive failure require additional hardware. For example, sensors or Laser Doppler Vibrometers are used to detect improper oscillation of a drive's heads. This additional hardware can increase the component count and the overall system costs.

Thus, there is a need in the art for a method of predicting drive failures without using additional hardware.

SUMMARY OF THE DISCLOSURE

To overcome the limitations in the prior art described above, and to overcome other limitations that will become apparent upon reading and understanding the present specification, the specification discloses a preferred method, apparatus, and article of manufacture for head disc interference detection using the standard deviation of read back signal frequency, which employs hardware existing in the disc drive and which does not require additional hardware.

The preferred embodiment of the present invention involves the following steps. First, the amount of longitudinal head oscillation in the hard drive is measured. Second, this measured amount of oscillation is compared to a predefined threshold value. Finally, a head disc interference alarm is activated when the oscillation is greater than the defined threshold value.

In further preferred embodiments of the present invention, the step of measuring further involves writing a constant frequency pattern onto a hard disc drive; reading back the written signals; collecting samples of the frequency register values from the phase lock loop (PLL) of the read channel timing recovery circuit; and calculating the standard deviation value of the samples.

Various advantages and features of novelty which characterize the invention are pointed out with particularity in the claims annexed hereto and form a part hereof. However, for a better understanding of the invention and its advantages, reference should be made to the drawings which form a further part hereof, and to accompanying descriptive matter, in which there is illustrated and described specific examples in accordance with preferred embodiments of the invention.

BRIEF DESCRIPTION OF THE DRAWINGS

Referring now to the drawings in which like reference numbers represent corresponding parts throughout:

FIGS. 4A–4F represent the frequency register values produced by the PLL system of FIGS. 3A–3B.

DETAILED DESCRIPTION OF PREFERRED EMBODIMENTS

In the following description of preferred embodiments, reference is made to the accompanying drawings which form a part hereof, and in which is shown by way of illustration a specific embodiment in which the invention may be practiced. It is to be understood that other embodiments may be utilized and structural changes may be made without departing from the scope of the preferred embodiments of the present invention.

Overview

Preferred embodiments of the present invention relate to a method for detecting head disc interference (HDI) in a hard drive system using the standard deviation of read back signal frequency.

Hardware Environment

Figure 1:
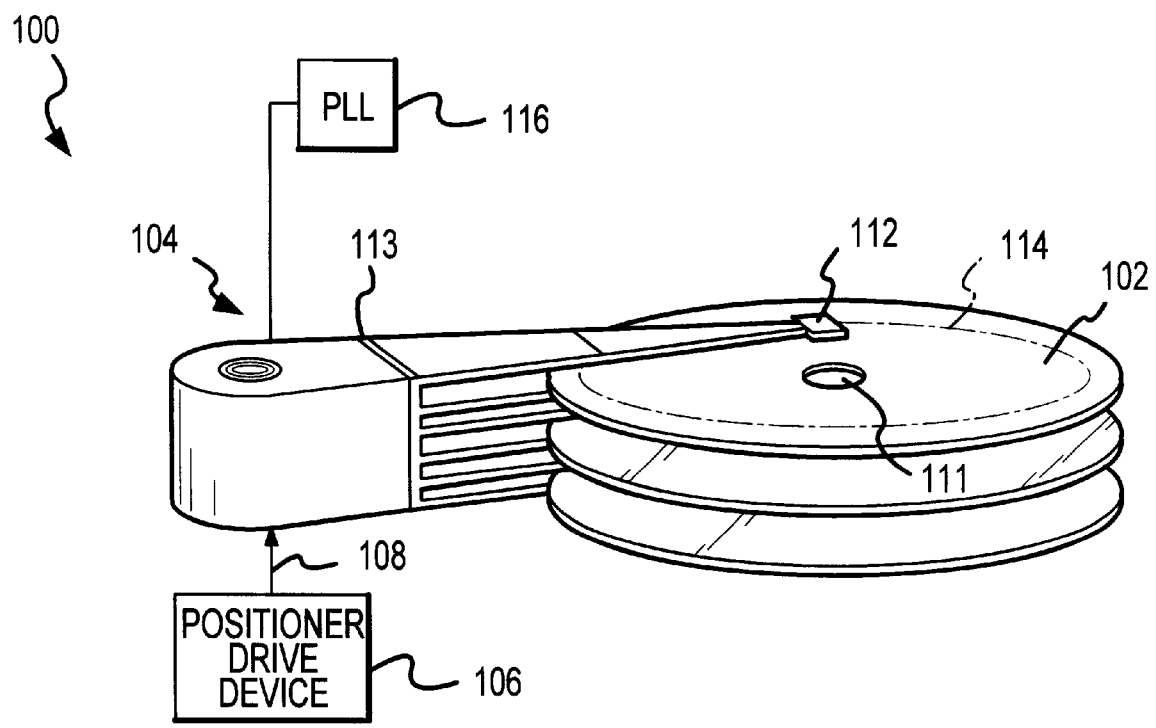
FIG. 1 illustrates an exemplary hard drive system used to implement a preferred embodiment of the present invention.

FIG. 1 illustrates an exemplary hard disc drive system that could be used to implement embodiments of the present invention. In the exemplary environment, a hard drive system 100 has at least one storage medium 102, a head assembly 104, a positioner drive device 106, and a mechanical linkage 108, connecting the positioner drive device 106 to the head assembly 104. The heads 112 are supported on the head assembly arm 113 and the head assembly 104 is driven by a position drive device 106 that moves heads 112 to selected positions relative to disc surfaces. Each head 112 is suspended adjacent to an associated recording surface of a corresponding storage medium 102 and performs the task of reading and/or writing a plurality of signals onto its associated data track 114. In the embodiment shown in FIG. 1, the storage media 102 includes magnetic recording discs. However, other embodiments may employ alternative forms of storage media 102 that operate with suspended heads 112.

The head assembly 104 is designed aerodynamically so that the head 112 flies across the storage medium 102 surface on an air bearing (or air cushion) created by the spinning storage medium 102. HDI is caused by the air bearing vibration that occurs when heads 112 fly over the storage media 102. This air bearing vibration causes the drive's transducer to move back and forth along the data track 114. As a result, the read back signal reads early (or late) at periodic timing intervals, creating a frequency modulation that is known as HDI.

In the illustrated embodiment of FIG. 1, three storage media 102, in the form of multi-track magnetic recording discs, are supported on a single spindle 111. Each disc has two recording surfaces (double sided) on which data may be written and/or read by the associated head 112. However, storage media 102 may be any suitable storage device, including but not limited to single sided storage devices. In addition, while three discs are shown in FIG. 1, other embodiments may include or operate with any suitable number of storage media 102.

The PLL 116 is a component of the drive's read channel timing recovery circuit. PLLs are typically used in the disc drive industry to recover the read clock and to generate the write clock at a variety of frequencies depending on which data zones are used.

Concerning the read clock, reading data from the disc is an asynchronous operation. The rotation of the disc is not synchronized with the system clock and the pulse peaks represent flux reversals that can have any phase with respect to the system clock. Therefore, it is necessary to extract a read clock from the data itself. The read clock establishes the timing of a bit cell size and is used to determine the bit value (0 or 1) within each data zone. Read clock extraction is done using a PLL which employs negative feedback to force a voltage controlled oscillator (VCO) to be in synchronism with the read signal.

Regarding generating the write clock, most disc drives use zone density recording (ZDR) because with ZDR the drive can be operated at a constant rotation speed. This means that near the outer diameter (OD) a higher data frequency is used while at the inner diameter (ID), a lower frequency is used in order to maintain the data rate. In order to achieve writing with a variety of frequencies at different zones, a type of PLL known as a frequency synthesizer is used to derive multiple output frequencies from a single input frequency.

A PLL 116 typically includes three basic components: (1) phase/frequency detector 300; (2) a low pass filter 302; and (3) a voltage-controlled oscillator (VCO) 304. The phase/ frequency detector 300 produces an output signal which is a function of the frequency difference between the incoming signal and the oscillator signal. The output of the phase/ frequency detector 300 is filtered by the low pass filter 302 for use as the frequency control input of the VCO 304. The VCO 304 is an oscillator that produces a periodic waveform, the frequency of which may be varied about some free running frequency, according to the low pass filter 302 output signal (frequency control input for the VCO).

Figure 2A:
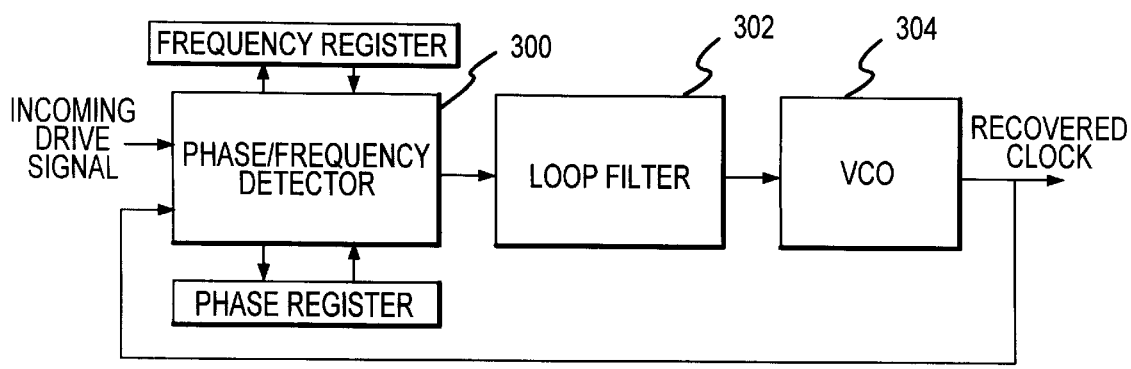
FIGS. 2A–2B illustrate a phase lock loop (PLL) system used for frequency modulation (FM) detection by a preferred embodiment of the invention.
Figure 2B:
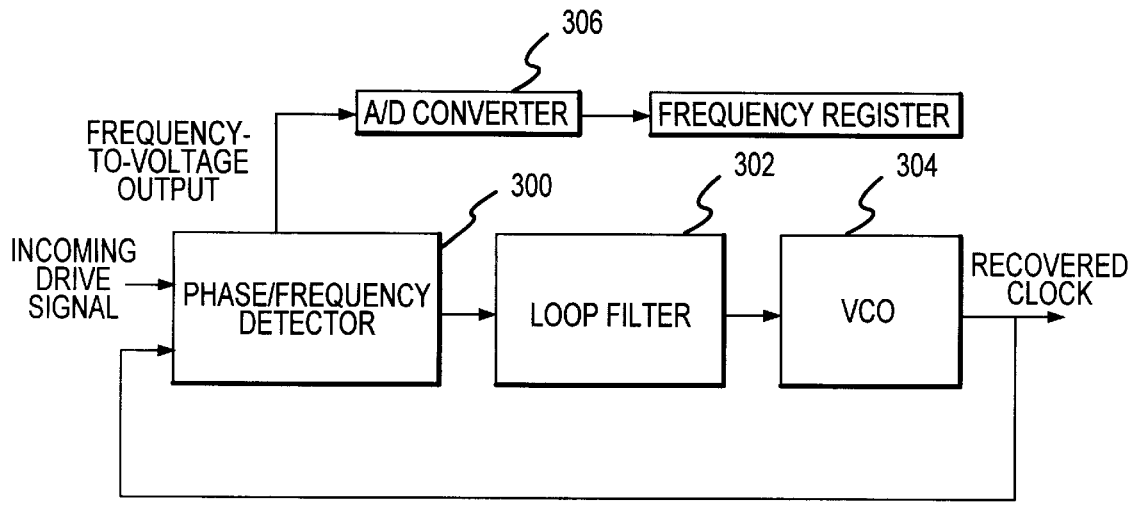

In a preferred embodiment of the present invention, the PLL 116 can either be a digital phase lock loop (DPLL) or an analogue phase lock loop (APLL). The APLL requires an analogue-to-digital (A/D) converter 306 to convert the analogue signal to a digital signal. FIGS. 2A–2B illustrate a DPLL and a APLL, respectively.

Because PLLs 116 are commonly used in the disc drive industry to recover the read clock and to generate the write clock, no additional hardware is required to detect the longitudinal head oscillation. In addition, frequency registers and A/D converters are commonly used in disc drives if the following conditions exists: (1) the drive's read channel chip uses digital partial response maximum likelihood ("PRML") instead of analogue PRML to perform data detection on read back signals and (2) the channel timing recovery circuit uses frequency recovery instead of phase recovery.

Those skilled in the art will recognize that the exemplary environment illustrated in FIG. 1 is not intended to limit the present invention. Indeed, those skilled in the art will recognize that other alternative hardware environments may be used without departing from the scope of the present invention.

Detecting Longitudinal Head Oscillation

HDI has proved to be detectable and measurable by detecting and measuring the amount of longitudinal head oscillation (caused by head disc interference). In accordance with preferred embodiments of the present invention, longitudinal head oscillation can be detected and measured by measuring the degree of frequency modulation (FM) in the read back signal of a previously written constant frequency pattern.

In preferred embodiments of the present invention, the frequency deviation in the read back signal, as a result of FM, is detected by determining the spread or distribution of the drive read back signal frequency. The drive read back signal frequency can be extracted from the phase/frequency detector of the PLL 116 of the drive's read channel timing recovery circuit.

Figure 3:
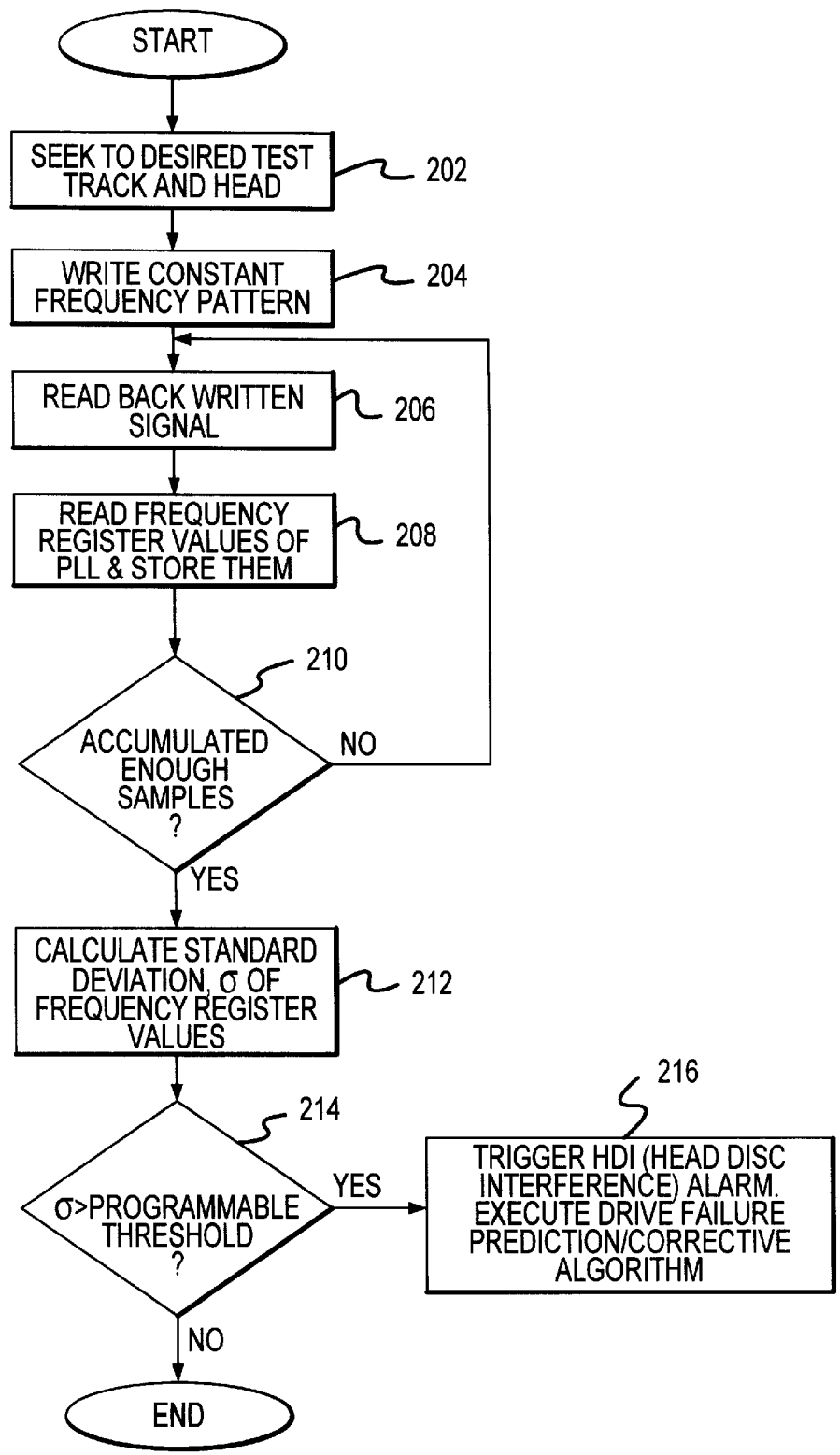
FIG. 3 is a flowchart illustrating the operation of a preferred embodiment of the present invention.
Figure 5A:
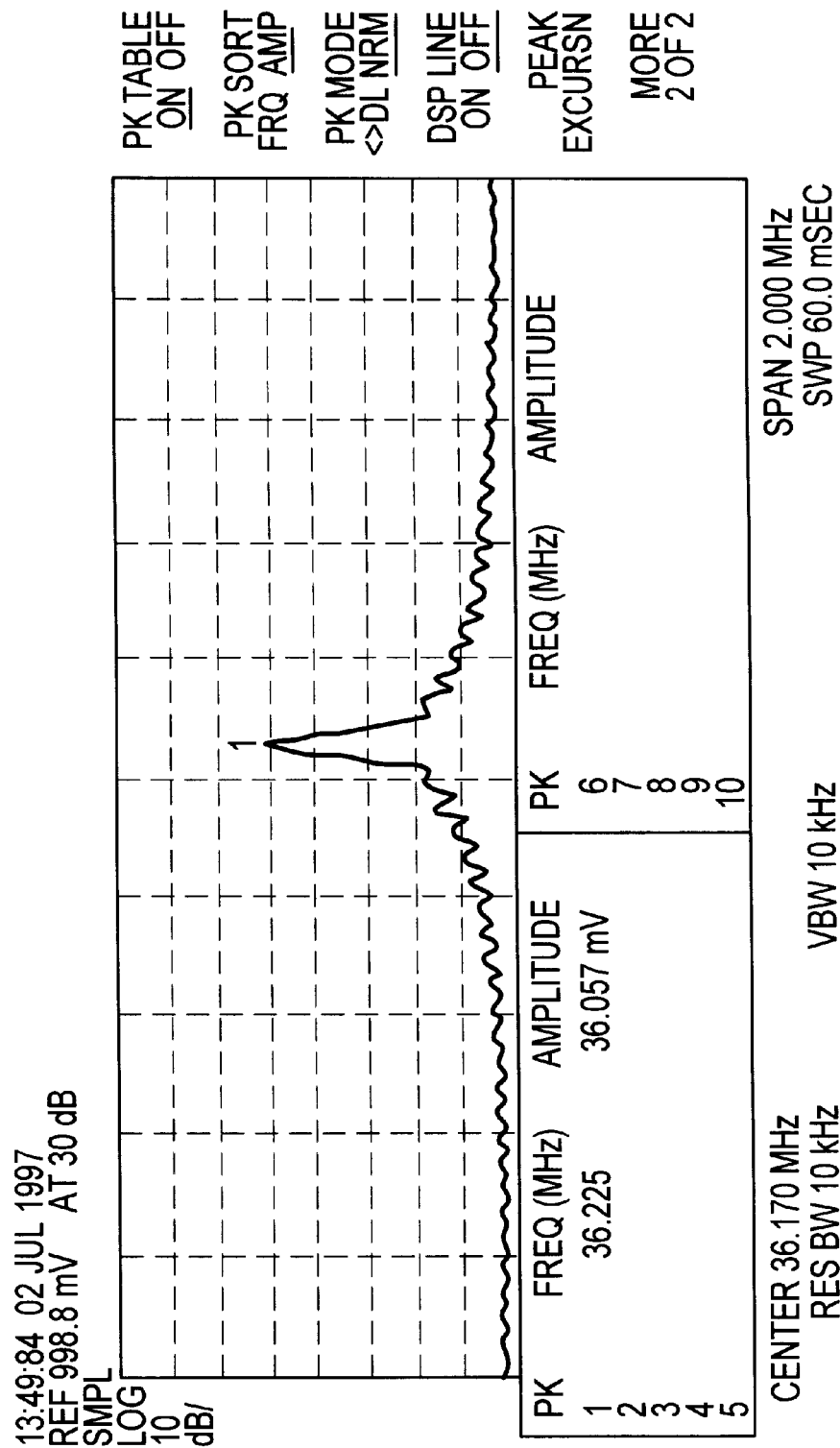
FIGS. 5A–5D are plots of the frequency spectra for drive read back signals.
Figure 5B:
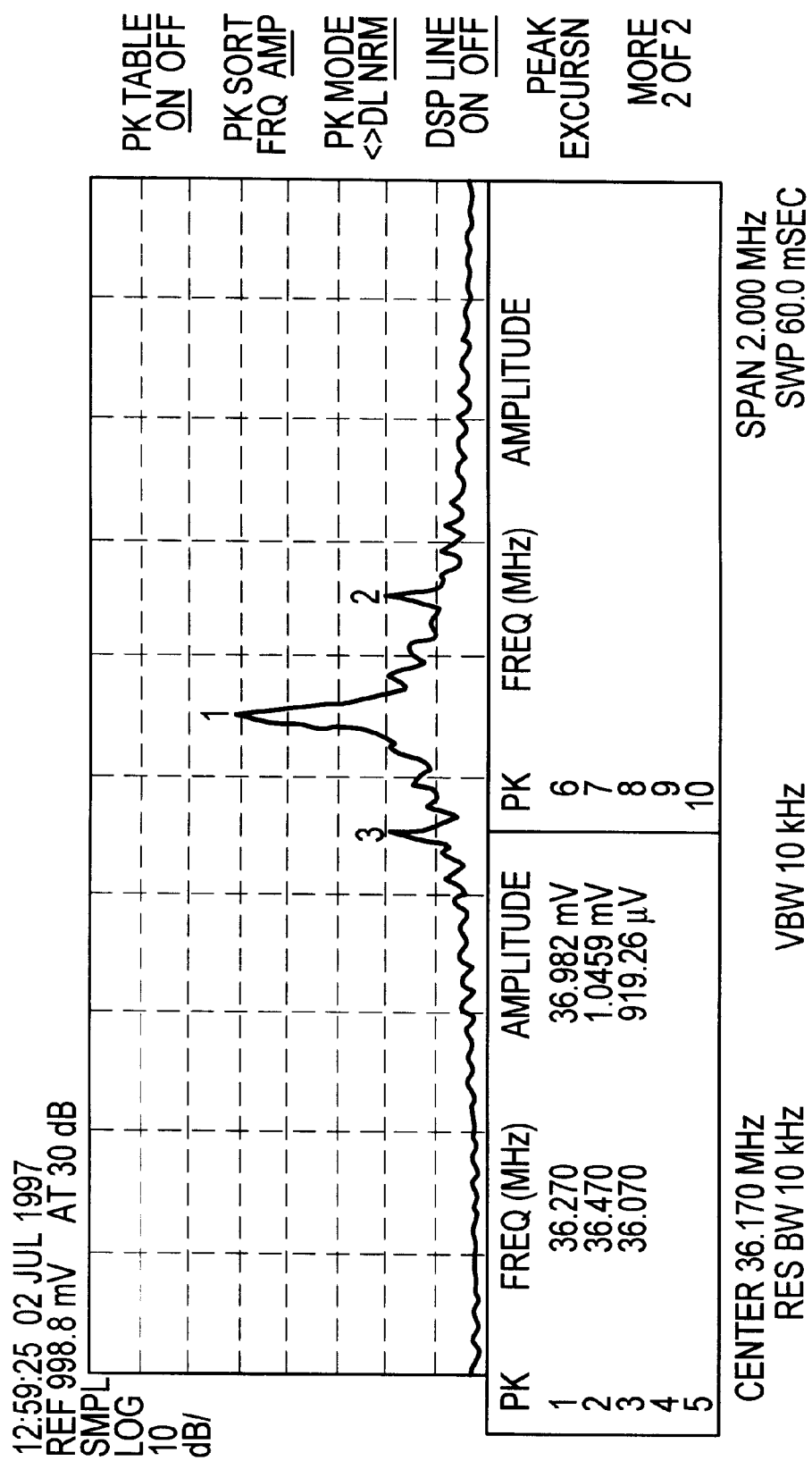
Figure 5C:
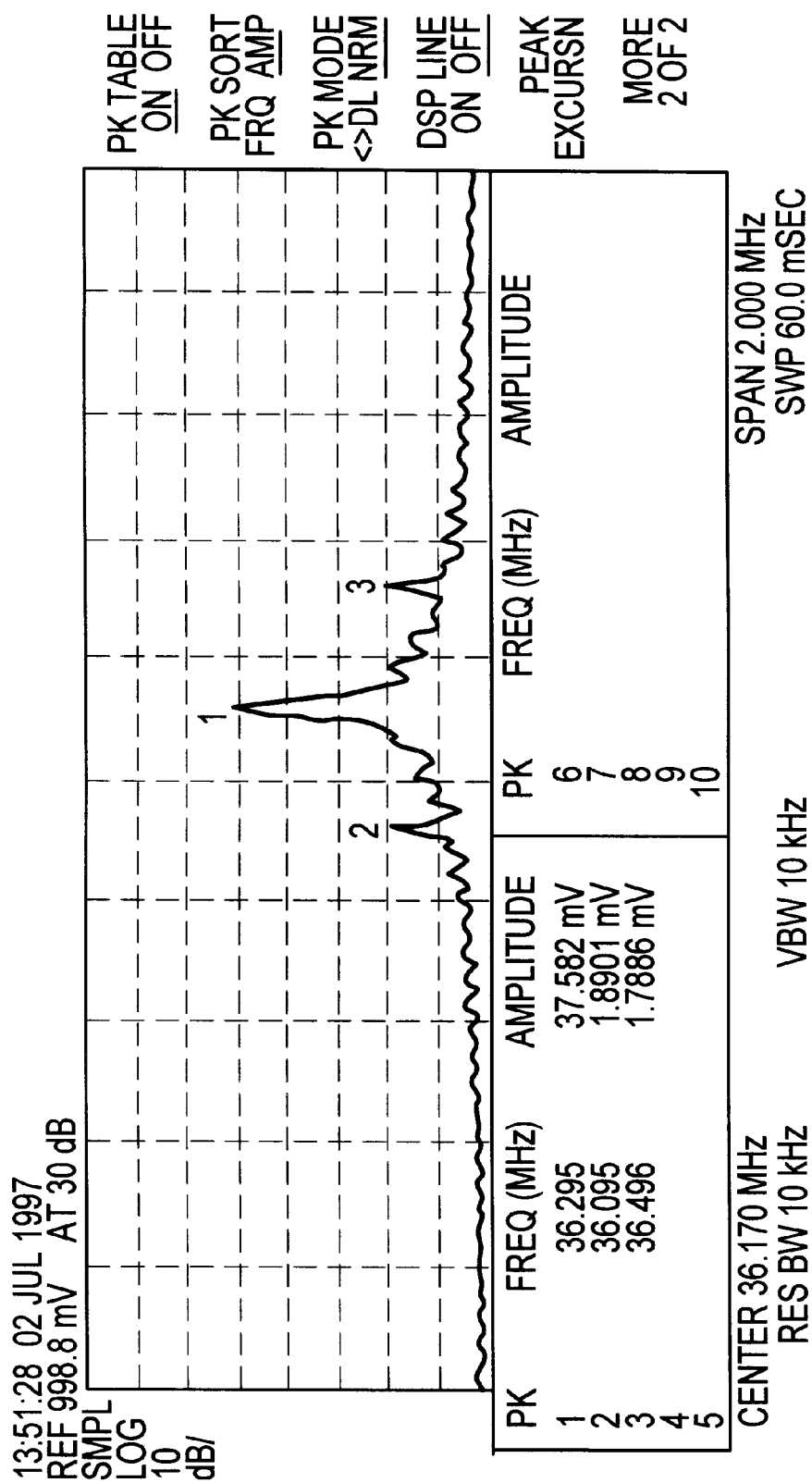
Figure 5D:
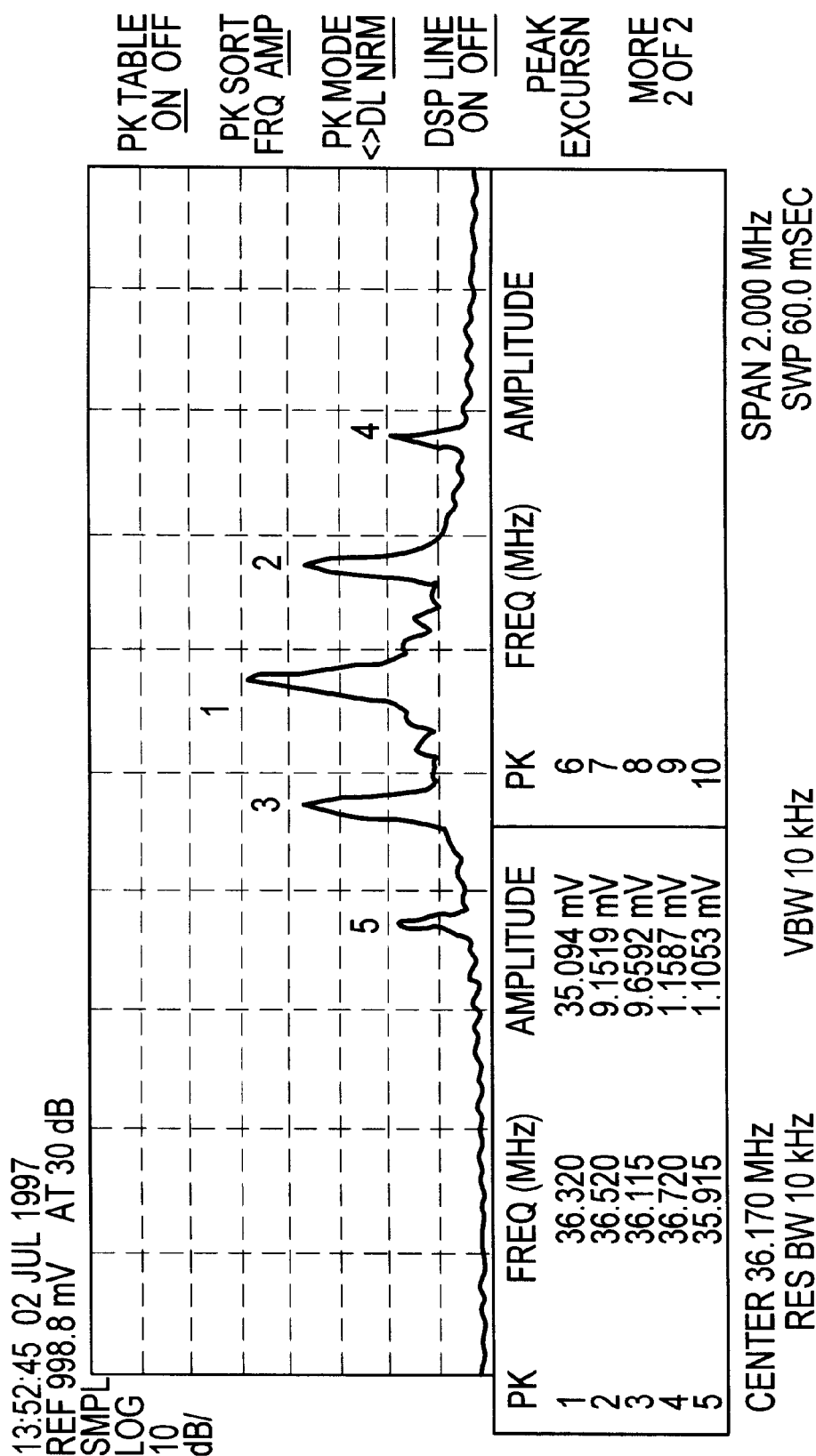

FIG. 3 is a flowchart illustrating the operation of a process according to an embodiment of the present invention. In accordance with this illustrated embodiment, a head 112 and a track 114 are selected from a write and read operation, as represented by block 202. As part of the block 202 operation, the selected head is moved to a position adjacent to the selected track location.

As represented by Block 204, a constant frequency pattern signal is written onto the track 114. The written signal is then read from the track 114, as represented by block 206. Block 208 represents the step of reading a frequency register value of a PLL 116 and storing the frequency register value in the memory of a computer.

Block 210 is a decision block that represents the step of determining whether enough samples have been accumulated. If so, the samples are used in the standard deviation calculation. Otherwise, if more samples are required, the preferred embodiment returns control to Block 206.

As represented by Block 212, the standard deviation value of the frequency register values is calculated. In the preferred embodiment, the standard deviation is calculated, for example, according to the following general equation for calculating a standard deviation:

$$STDEV \equiv \sqrt{\frac{n \sum Freq^2 - (\sum Freq)^2}{n(n-1)}}$$

In the above equation, Freq is the frequency register value and n is the number of samples.

Block 214 is a decision block that represents the step of determining whether the standard deviation is greater than a pre-defined programmable threshold. Setting a threshold value allows computer operators to screen out drives with even the slightest amount of HDI. The threshold value can also be set so that it screens out only those drives with severe HDI. If the standard deviation is less than the threshold, the drive has an acceptable amount of HDI. Otherwise, if the standard deviation is greater than the threshold, the illustrated embodiment proceeds to Block 216.

Block 216 represents the step of triggering a HDI alarm and executing a drive failure predictive/ corrective application.

Determining a Threshold Value

To define the threshold value according to a preferred embodiment of the present invention, a computer operator first runs a test case. The test case involves the following steps:

1. simulating a head with HDI by writing a FM signal onto the storage media 102;
2. writing a constant frequency pattern on the storage media 102;
2. reading back the written signals;
3. collecting samples of the frequency register values; and 4. calculating the standard deviation.

Results of six exemplary tests are shown in FIGS. 4A–4F. Each figure represents the performance of a head 112. Therefore, particular heads 112 suffering from HDI can be identified.

For the test cases, a 200 kHz modulating frequency with modulation indices of β equal 0.0, 0.05, 0.1, and 0.5 is used. FIGS. 5A–5D are plots of the frequency spectra for the drive read back signals, indicating varying degrees of FM, i.e. modulation indices of β equal 0.0, 0.05, 0.1, and 0.5.

In all six test cases, there is a significant difference between the standard deviation values for the various modulation indices. The standard deviation reflects the value of the modulation index or degree of FM. Since the degree of FM in the drive read back signal is a result of the amount of longitudinal head oscillation caused by HDI, the standard deviation of the drive read back signal frequency varies with the amount of HDI. Thus, if the intent is to screen out drives with even the slightest amount of FM as a result of HDI, the threshold may be set, for example, at about 1.9. If the intent is to screen out only those drives with severe HDI (for example, β greater than 0.5), the threshold may be set, for example, at about 10.

Conclusion

This concludes the description of the preferred embodiment of the invention. The present specification discloses a method, apparatus, and article of manufacture for HDI detection using the standard deviation of read back signal frequency.

The foregoing description of the preferred embodiment of the invention has been presented for the purposes of illustration and description. It is not intended to be exhaustive or to limit the invention to the precise form disclosed. Many modifications and variations are possible in light of the above teaching. It is intended that the scope of the invention be limited not by this detailed description, but rather by the claims appended hereto.

What is claimed is:

1. A method for detecting head disc interference in a disc drive comprising steps of:
    (a) writing a constant frequency pattern signal onto a disc;
    (b) reading the written signal from said disc;
    (c) collecting a plurality of samples of a frequency deviation in the read back signal;
    (d) calculating a standard deviation value of the samples;
    (e) converting the standard deviation value to a measured amount of longitudinal head oscillation;
    (f) comparing the measured amount of oscillation to a defined threshold value; and
    (g) triggering a head disc interference alarm when the measured amount of oscillation is greater than the defined threshold value.

2. A method for detecting head disc interference in a disc drive comprising steps of:
    (a) writing a constant frequency pattern signal onto a disc;
    (b) reading the written signal from said disc;
    (c) sampling a desired number of frequency register values of a phase lock loop (PLL), said PLL being a component of the disc drive's read channel timing recovery circuit;
    (d) storing the frequency register values in a memory of a computer for a frequency deviation calculation related to the constant frequency pattern written to the disc;
    (e) calculating a frequency deviation value and converting the frequency deviation value to a measured amount of longitudinal head oscillation;
    (f) comparing the measured amount of oscillation to a defined threshold value; and
    (g) triggering a head disc interference alarm when the measured amount of oscillation is greater than the defined threshold value.

3. The method of claim 2 wherein the sampling step (c) comprises:
    sampling the frequency register values of a digital phase lock loop (DPLL), said DPLL being a component of the disc drive's read channel timing recovery circuit.

4. The method of claim 2 wherein the sampling step (c) comprises:
    (c)(1) sampling the frequency register values of an analogue phase lock loop (APLL), said APLL being a component of the disc drive's read channel recovery circuit; and
    (c)(2) converting an analogue signal to a digital signal.

5. An apparatus for detecting head disc interference in a drive comprising:
    a computer having a microprocessor and a memory;
    a write module writing a constant frequency pattern signal onto a disc;
    a read module reading the written signal from said disc; and
    a plurality of registers wherein the microprocessor stores a collected plurality of samples of a frequency deviation in the read back signal,
    a test module measuring longitudinal head oscillation, wherein the test module comprises a sampling circuit sampling a desired number of frequency register values of a phase lock loop (PLL), said PLL being a component of a disc drive's read channel timing recovery circuit, the test module further comprises a memory controller storing the frequency register values in a memory of a computer for calculating a frequency deviation value and converting the frequency deviation value to a head oscillation value; and
    wherein the microprocessor compares the oscillation value to a defined threshold value to determine whether the oscillation value represents head disc interference.

6. The apparatus of claim 5 wherein
    the microprocessor calculates a standard deviation value of the samples and converts the standard deviation value to the longitudinal head oscillation value.

7. The apparatus of claim 5 wherein the PLL comprises:
    a digital phase lock loop.

8. The apparatus of claim 5 wherein the PLL comprises:
    an analogue phase lock loop; and
    an analogue to digital converter converting an analogue signal to a digital signal.

9. A computer storage medium readable by a computer and encoding a computer program of instructions executable by the computer to perform a computer process for detecting a head disc interference in a hard-disc drive, said computer process comprising steps of:
    writing a constant frequency pattern signal onto a disc;
    reading the written signal from said disc;
    sampling a desired number of frequency register values of a phase lock loop (PLL) wherein the frequency register values relate to a read back signal from the disc, said PLL being a component of the a disc drive's read channel timing recovery circuit; and
    storing the frequency register values in a memory of the computer;

determining a longitudinal head oscillation value related to frequency modulation in the read back signal;

comparing said oscillation value to a defined threshold value; and triggering a head disc interference alarm when the oscillation is greater than the defined threshold value.

10. The computer storage medium of claim 9 wherein the computer process step of measuring further comprises steps of:

calculating a standard deviation value of the samples; and converting the standard deviation value to a longitudinal head oscillation value.

11. The computer storage medium of claim 9 wherein the computer process step of sampling further comprises:

sampling the frequency register values, of a digital phase lock loop (DPLL), said DPLL being a component of the disc drive's read channel timing recovery circuit.

12. The computer storage medium of claim 9 wherein the computer process step of sampling further comprises steps of:

sampling the frequency register values, wherein said values are produced by a frequency register of an analogue phase lock loop (APLL), said APLL being a component of the disc drive's read channel recovery circuit; and converting an analogue signal to a digital signal.

* * * * *